US011495920B2

(12) United States Patent
AbuGhazaleh et al.

(10) Patent No.: US 11,495,920 B2
(45) Date of Patent: *Nov. 8, 2022

(54) POWER CONNECTOR WITH INTEGRATED STATUS MONITORING

(71) Applicant: Hubbell Incorporated, Shelton, CT (US)

(72) Inventors: Shadi Alex AbuGhazaleh, Guilford, CT (US); Matthew Samojeden, Rye, NY (US); Ryan Papageorge, Shelton, CT (US); Thomas Scanzillo, Monroe, CT (US); Michael Williams, Watertown, CT (US)

(73) Assignee: Hubbell Incorporated, Shelton, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/193,458

(22) Filed: Mar. 5, 2021

(65) Prior Publication Data
US 2021/0194188 A1 Jun. 24, 2021

Related U.S. Application Data

(63) Continuation of application No. 15/992,973, filed on May 30, 2018, now Pat. No. 10,944,219.
(Continued)

(51) Int. Cl.
*H01R 13/66* (2006.01)
*G01R 19/165* (2006.01)
(Continued)

(52) U.S. Cl.
CPC ....... *H01R 13/6683* (2013.01); *G01R 1/0416* (2013.01); *G01R 19/165* (2013.01);
(Continued)

(58) Field of Classification Search
CPC .............. G01R 19/165; G01R 19/2513; G01R 31/2827; H01R 13/6691; G06F 11/3058;
(Continued)

(56) References Cited

U.S. PATENT DOCUMENTS 5,959,529 A * 9/1999 Kail, IV .................. G01S 19/17
340/539.12
5,995,911 A * 11/1999 Hart ..................... G01R 15/183
324/126
(Continued)

FOREIGN PATENT DOCUMENTS

CN 103339518 10/2013
CN 204360523 5/2015
(Continued)

OTHER PUBLICATIONS

European Patent Application No. 18809840 Supplementary European Search Report and Examination Opinion dated Jan. 26, 2021.
(Continued)

*Primary Examiner* — Mirza F Alam
(74) *Attorney, Agent, or Firm* — Michael Best & Friedrich LLP

(57) ABSTRACT

An electrical power system including an electrical power connector, a contact configured to electrically connect a power supply to a load, a first sensor configured to sense a first characteristic of the electrical power connector, a second sensor configured to sense a second characteristic of the electrical power connector, and an electronic controller. The electronic controller configured to receive a first signal indicative of the first characteristic, receive a second signal indicative of the second characteristic, compare the first signal to a first threshold, compare the second signal to a second threshold, and dynamically adjust at least one selected from a group consisting of the first threshold and the second threshold. Wherein the dynamic adjustment is based
(Continued)

on at least one selected from a group consisting of a measured or calculated parameter, an installation condition, an operational limit, a known operational behavior, and parameter threshold information.

20 Claims, 9 Drawing Sheets

Related U.S. Application Data

(60) Provisional application No. 62/544,097, filed on Aug. 11, 2017, provisional application No. 62/512,479, filed on May 30, 2017.

(51) Int. Cl.
    *H01R 43/00*      (2006.01)
    *G01R 1/04*       (2006.01)
    *G01R 19/25*      (2006.01)
    *G01R 31/50*      (2020.01)
    *H01R 103/00*     (2006.01)
    *H01R 24/22*      (2011.01)

(52) U.S. Cl.
    CPC ......... *G01R 19/2513* (2013.01); *G01R 31/50* (2020.01); *H01R 13/6691* (2013.01); *H01R 43/002* (2013.01); *H01R 24/22* (2013.01); *H01R 2103/00* (2013.01)

(58) Field of Classification Search
    CPC ............... G06F 11/3089; G08B 21/185; Y10T 307/469
    See application file for complete search history.

(56) References Cited

U.S. PATENT DOCUMENTS

| | | | | |
|---|---|---|---|---|
| 6,049,143 A | * | 4/2000 | Simpson | H01R 13/7039 |
| | | | | 307/126 |
| 2002/0064983 A1 | * | 5/2002 | Patey | H01R 13/7038 |
| | | | | 439/152 |
| 2005/0071093 A1 | | 3/2005 | Stefan | |
| 2009/0079400 A1 | * | 3/2009 | Basic | H02P 29/64 |
| | | | | 322/99 |
| 2009/0278647 A1 | * | 11/2009 | Buswell | H01F 3/06 |
| | | | | 336/182 |
| 2011/0320834 A1 | * | 12/2011 | Ingels | G06F 1/266 |
| | | | | 713/310 |
| 2014/0167503 A1 | * | 6/2014 | Redpath | H02J 9/06 |
| | | | | 307/23 |
| 2014/0032754 A1 | | 11/2014 | Shin | |
| 2016/0034323 A1 | | 11/2016 | Itzler | |
| 2016/0335550 A1 | * | 11/2016 | Achin | G06N 5/02 |
| 2016/0343232 A1 | | 11/2016 | Itzler et al. | |

FOREIGN PATENT DOCUMENTS

| | | |
|---|---|---|
| EP | 2364874 | 9/2011 |
| EP | 3079062 | 10/2016 |
| KR | 20160056873 | 5/2016 |
| KR | 101723234 | 4/2017 |

OTHER PUBLICATIONS

PCT/US2018/035104 International Search Report and Written Opinion dated Aug. 10, 2018.
Chinese Patent Application No. 201880040412.4 First Office Action Issued by the China National Intellectual Property Administration (and translation) dated Feb. 24, 2021.

* cited by examiner

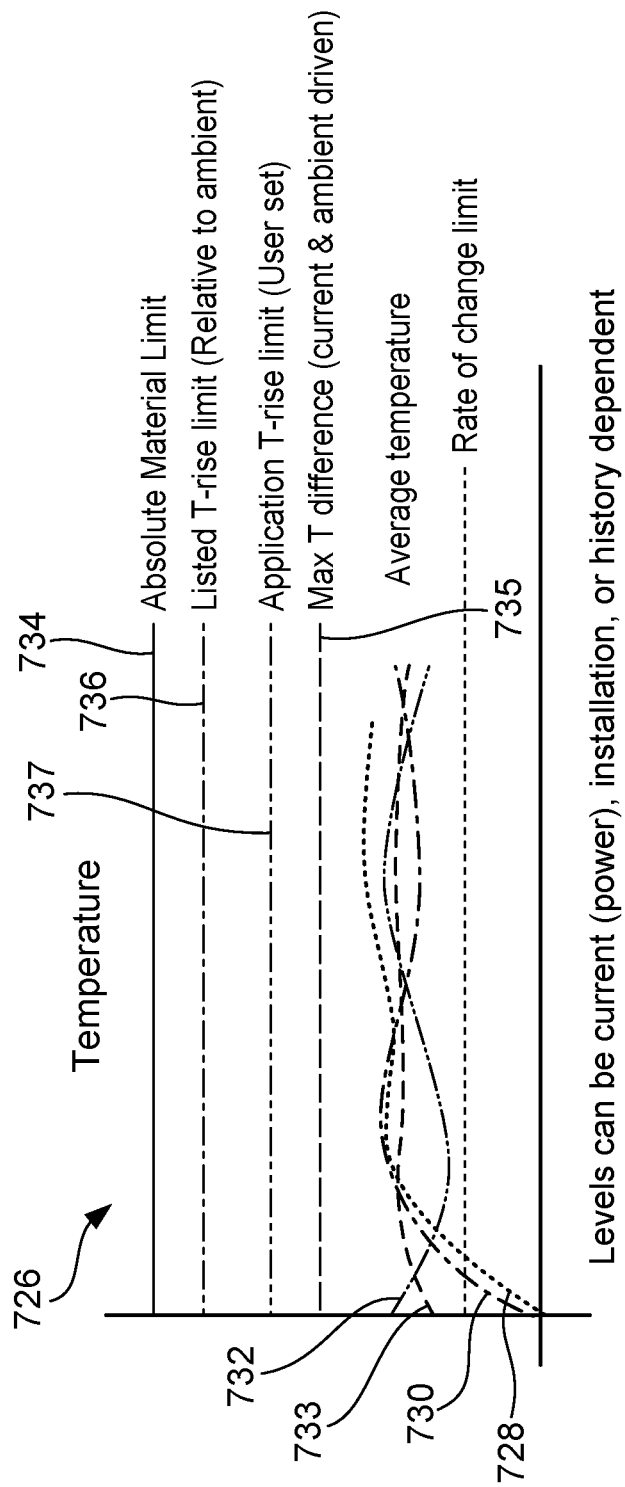

POWER CONNECTOR WITH INTEGRATED STATUS MONITORING

RELATED APPLICATIONS

This application claims the benefit to U.S. patent application Ser. No. 15/992,973, filed May 30, 2018, which claims benefit to U.S. Provisional Patent Application No. 62/544,097, filed on Aug. 11, 2017, which claims the benefit to U.S. Provisional Patent Application No. 62/512,479, filed on May 30, 2017, the entire contents of both which are incorporated herein by reference.

FIELD

Embodiments relate to electrical power connectors.

SUMMARY

Electrical power connectors provide a connection between a power supply and a load. Such electrical power connectors may be described in U.S. patent application Ser. No. 15/072,672, filed Mar. 17, 2016, which is hereby incorporated by reference.

Power measurements can be used to monitor the power consumption of the equipment connected through an electrical power connector. In some cases, the ability to accurately measure the power consumption enables an operator to allocate energy costs to various users based on the usage of the equipment.

Internal and environmental monitoring, in particular temperature, current, and voltage, may be used to identify normal versus abnormal operating conditions. Continuous measurement enables identification of changes in operating parameters that are out of acceptable ranges so that an alert is triggered to notify the operators to the condition. Furthermore, data analytics and understanding the normal operating parameters help provide the user with predictive, or preventive, alerts before a potential failure occurs due to environmental, installation, or internal hardware anomalies.

Other aspects of the application will become apparent by consideration of the detailed description and accompanying drawings.

BRIEF DESCRIPTION OF THE DRAWINGS

FIG. 7C is a graph illustrating a temperature parameter and parameter thresholds of the power system of FIG. 1.

DETAILED DESCRIPTION

Before any embodiments of the application are explained in detail, it is to be understood that the application is not limited in its application to the details of construction and the arrangement of components set forth in the following description or illustrated in the following drawings. For ease of description, some or all of the example systems presented herein are illustrated with a single exemplar of each of its component parts. Some examples may not describe or illustrate all components of the systems. Other exemplary embodiments may include more or fewer of each of the illustrated components, may combine some components, or may include additional or alternative components. The application is capable of other embodiments and of being practiced or of being carried out in various ways.

It should be understood that although the example system described is an electrical connector system, the application may be applied to other systems including electrical connections. For example, also illustrated as a pin and sleeve device, in other embodiments, the power system may include switches, disconnects, or other wiring devices.

Figure 1:
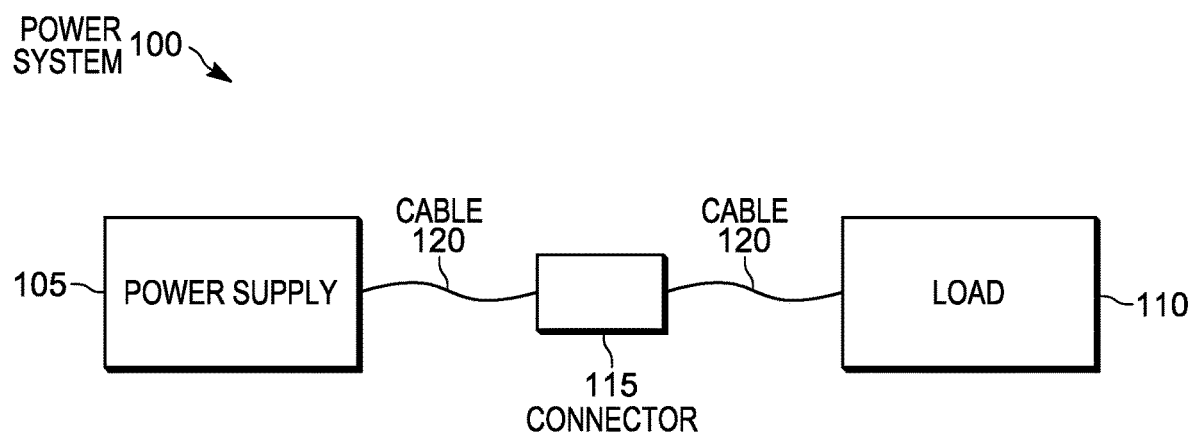
FIG. 1 is a block diagram of an electrical power system according to one embodiment of the application.

FIG. 1 illustrates an electrical power system 100 according to some embodiments of the application. The power system 100 includes a power supply 105, a load 110, an electrical power connector, or connector, 115, and a power supply cable 120. In some embodiments, the power supply 105 is a single-phase power supply outputting a voltage within a range of approximately 100 VAC to approximately 240 VAC. In other embodiments, the power supply 105 is a three-phase power supply outputting a voltage within a range of approximately 208 VAC to approximately 600 VAC. In some embodiments, the power supply 105 is a direct-current power supply outputting a voltage within a range of approximately 350 VDC to approximately 450 VDC. In other embodiments, the power supply 105 is a direct-current power supply outputting a voltage within a range of approximately 44 VDC to approximately 60 VDC (for example, 48 VDC). In yet another embodiment, the power supply 105 is a direct-current power supply outputting a voltage within a range of approximately 15 VDC to approximately 30 VDC (for example, 48 VDC). The load 110 may be any electrical device or system configured to receive power.

Figure 2:
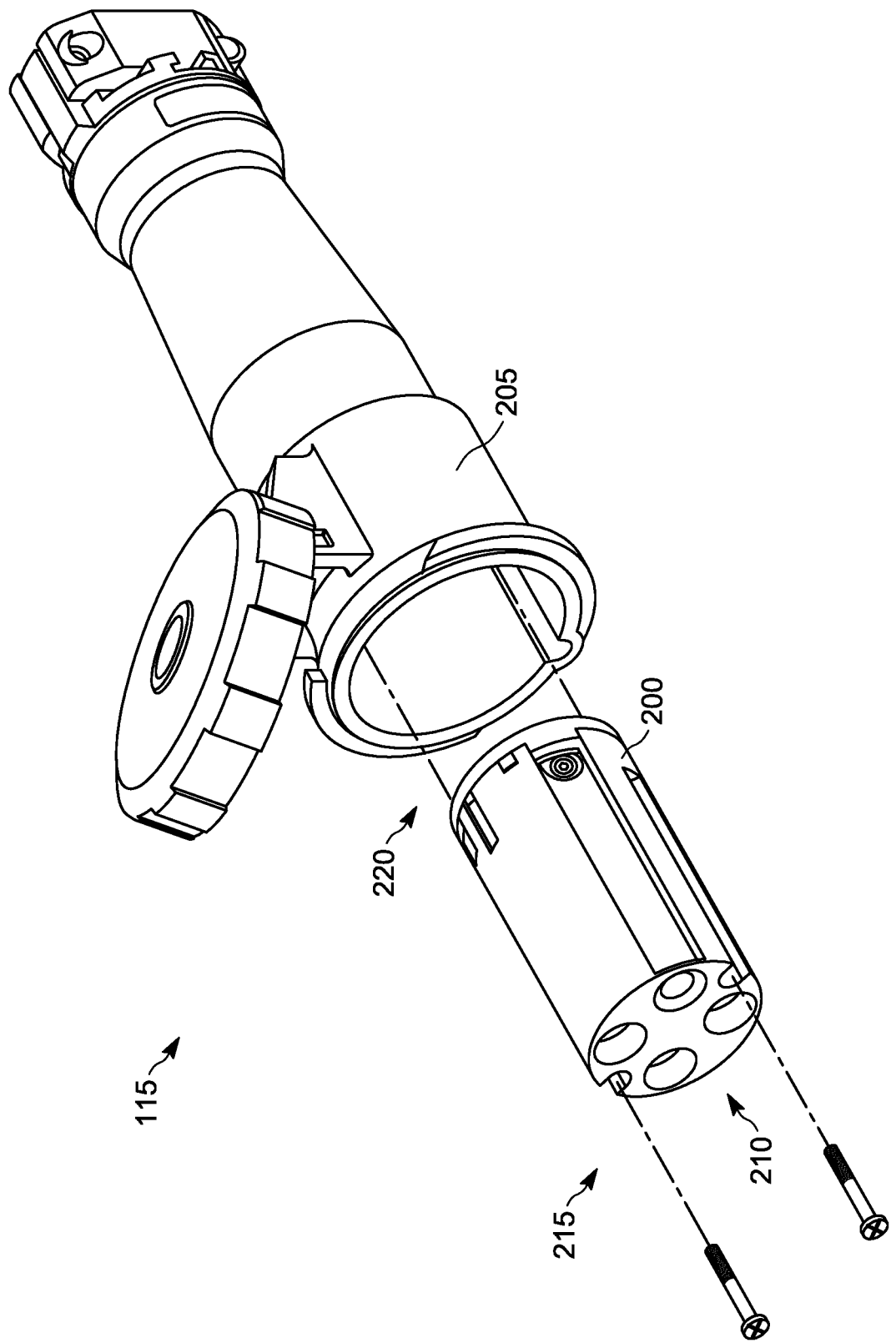
FIG. 2 is a perspective view of an electrical power connector of the power system of FIG. 1 according to some embodiments of the application.

FIG. 2 illustrates the connector 115 according to an embodiment of the application. The electrical power connector 115 is configured to provide an electrical connection between the power supply 105 and the load 110. The connector 115 may be configured to handle twenty-amps, thirty-amps, sixty-amps, one-hundred amps, etc. As illustrated, the connector 115 includes a contact carrier 200 and a sleeve connector 205. The contact carrier 200 includes one or more power terminals 210 located on a first end 215 of the contact carrier 200. Although not illustrated, the contact carrier 200 may further include one or more second power terminals located on a second end 220 of the contact carrier 200. Although illustrated as having four power terminals 210, the connector 115 may include any number of power terminals and second power terminals (for example one power terminal and one second power terminal, two power terminals and two second power terminals, three power terminals and three second power terminals, four power terminals and four second power terminals, five power terminals and five second power terminals, etc). In some embodiments, the power terminals 210 are electrically connected to the load 110 while the second power terminals are electrically connected to the power supply 105.

Figure 3A:
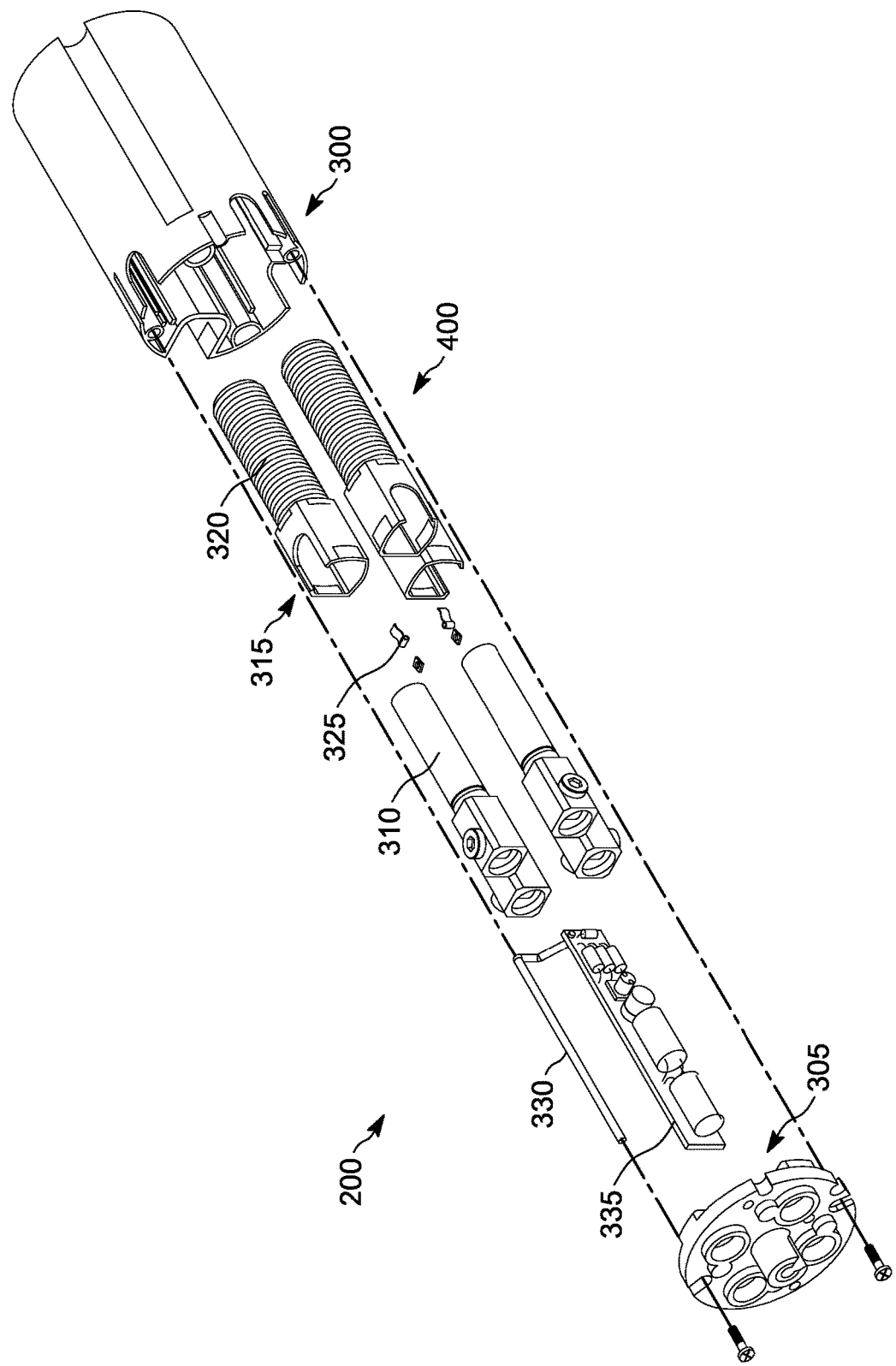
FIG. 3A is a break away view of a contact carrier of the electrical power connector of FIG. 2 according to some embodiments of the application.
Figure 3B:
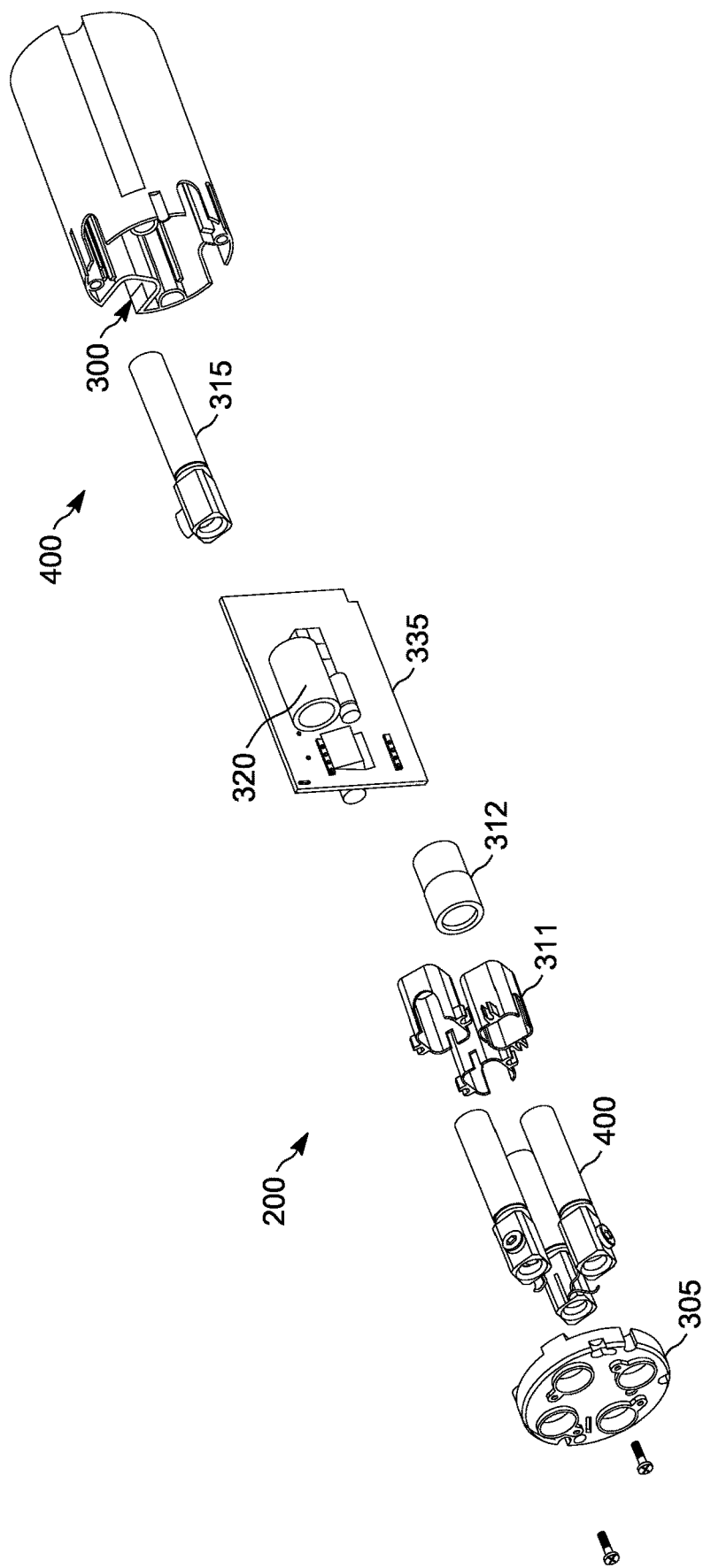
FIG. 3B is a break away view of a contact carrier of the electrical power connector of FIG. 2 according to some embodiments of the application.
Figure 4:
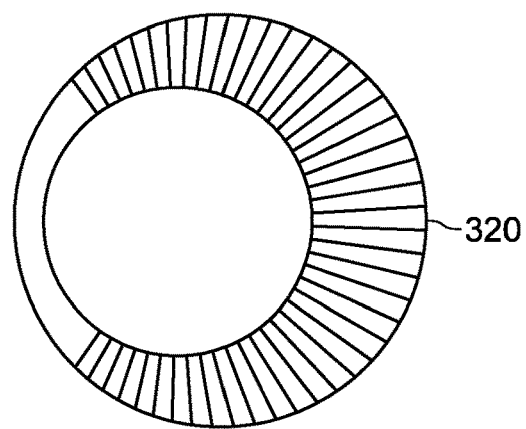
FIG. 4 is a top view of a transformer winding according to another embodiment of the application.
Figure 5:
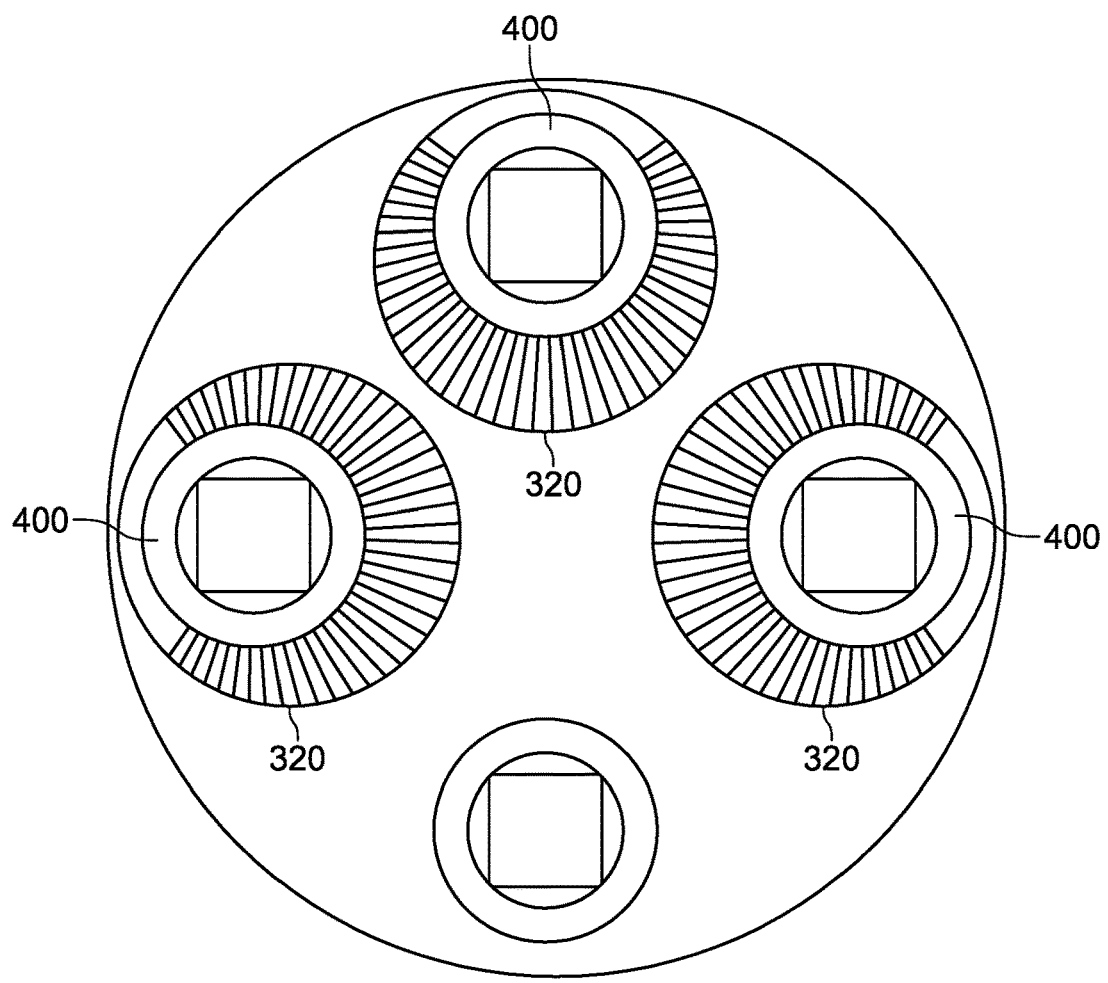
FIG. 5 is a top view of a contact carrier including the transformer of FIG. 4 according to an embodiment of the application.

FIGS. 3A & 3B illustrate the contact carrier 200 according to various embodiments of the application. As illustrated, the contact carrier 200 includes a shell 300, a cover 305, one or more contact transformer (CT) modules 400, one or more sensors 325, an electronic controller 335, and an antenna 330. The CT modules 400 each include one or more connector contacts 310 and one or more contact cores 315. The shell 300 is formed of a non-conductive material, such as but not limited to, a plastic material. The cover 305 is also formed of a nonconductive material, such as but not limited to, a plastic material. The shell 300, in conjunction with the cover 305, houses various components of the contact carrier 200. The one or more connector contacts 310 provide an electrical connection between the power terminals 210 and the second power terminals. The contact cores 315 are configured to receive the respective connector contacts 310. The contact cores 315 include transformer windings 320 integrated into the contact cores 315. The transformer windings 320 sense current travelling through the respective connector contacts 310. As illustrated in FIGS. 4 & 5, in some embodiments, the transformer windings 320 have a substantially toroidal shape. In some embodiments, a three-phase power supply may be monitored using two sets of transformer windings 320.

In some embodiments, the electronic controller 335 includes an electronic processor and a memory (not shown). The electronic processor obtains and provides information (for example, from the memory, the sensors 325, and/or the antenna 330), and processes the information by, for example, executing one or more software instructions or modules, capable of being stored, in the memory or another non-transitory computer readable medium (not shown). The software can include firmware, one or more applications, program data, filters, rules, one or more program modules, and other executable instructions. In some embodiments, the electronic controller 335 may further include a user interface (not shown). The user interface may receive input from, for example, a user of the connector 115, provides system output, or a combination of both. System output may be provided via audio and/or visual feedback. For example, the connector 115 may include a display as part of the user interface. The display may be a suitable display, for example, a liquid crystal display (LCD) touch screen, or an organic light-emitting diode (OLED) touch screen. Alternative embodiments may include other output mechanisms such as, for example, light sources (not shown). Input may be provided via, for example, a keypad, soft keys, icons, or soft buttons on the display, a scroll ball, buttons, and the like. The user interface may include a graphical user interface (GUI) (for example, generated by the electronic processor, from instructions and data stored in the memory, and presented on the display) that enables a user to interact with the connector 115. In some embodiments, the connector 115 may utilize a user interface of an external communication device and/or the load 110 to receive input and provide information. In yet other embodiments, the user may provide and/or receive input/output with the connector 115 via an external device (for example, a smartphone, a tablet, etc.).

In some embodiments, one or more of the sensors 325 are temperature sensors configured to sense temperatures central to the core of the connector 115. In some embodiments, the sensors 325 may sense the temperature of one or more points of the contact carrier 200. For example, such sensors may be positioned at multiple connection points and terminals within the connector 115 and configured to sense individual temperatures of particular terminals. Such sensors may also include an ambient temperature sensor for sensing a temperature external the contact carrier 200 and/or external to the connector 115. Such a sensor may be located inside or external to the connector 115. In some embodiments, the sensors 325 include thermistors, thermocouples, resistance temperature detector (RTDs), or any similar sensor. In some embodiments, the sensors 325 include one or more humidity and/or moisture sensors. In some embodiments, the one or more sensors 325 are configured to sense an electrical characteristic of the power system 100. For example, such sensors may be configured to sense the voltage between the power supply 105 and the load 110 and/or a temperature of the contact 310. In some embodiments, one or more of the sensors 325 are positioned outside of the connector 115.

In the illustrated embodiment, the antenna 330 is routed from the electronic controller 335 along the outside wall of the shell 300. In such an embodiment, the antenna 330 may be disposed inside the shell 300 and/or outside the shell 300. In some embodiments, the antenna 330 may be held in place by one or more slots in support ribs and/or holes adjacent the outside wall. The antenna 330 may be a dipole-type antenna, a loop-type antenna, a flat chip antenna, or any other known antenna. The antenna 330 is configured to wirelessly transmit various characteristics of the connector 115. For example, the antenna 330 may wirelessly transmit current, voltage, and temperature measurements from one or more sensors 325 within the connector 115. In some embodiments, the characteristics are wirelessly transmitted to one or more external devices. Such external devices may include the load device 110, a communication device (i.e. a phone, a tablet, a computer), a wiring device, and/or a remote server/database or cloud network. In some embodiments, rather than, or in addition to, antenna 330, the contact carrier 200 may include an input/output port. In such an embodiment, the various characteristics described above may be transmitted via physical coupling (for example, a wired connection). In some embodiments, the electronic controller 335 is partially (i.e. some of the components of the electronic controller 335) located within the connector 115 and partially located on at least one selected from the group consisting of an external communication device, an external wiring device, a remote server, and a cloud network.

The memory can include random access memory (RAM), read only memory (ROM), or one or more other non-transitory computer-readable media, and may include a program storage area and a data storage area. The program storage area and the data storage area can include combinations of different types of memory, as described herein. In one embodiment, the electronic processor of the electronic controller 335 is configured to retrieve from the memory and execute, among other things, software related to control processes, for example, the methods described herein. For example, as described more particularly below with respect to FIG. 4, the electronic controller 335 (in particular, the electronic processor) may be fully configured to determine a status of a load device based on one or more environmental or operational inputs. In some embodiments, the electronic controller 335 may be configured to provide information to an external device and/or remote server/database so that the external device and/or remote server/database may determine a status of a load device based on one or more environmental or operational inputs.

FIG. 3B illustrates the contact carrier 200 according to another embodiment. Such an embodiment further includes an insulating sleeve 311 and a spacer 312. The insulating sleeve 311 is configured to receive the one or more connector contacts 310.

FIG. 4 illustrates biased transformer windings 320 according to another embodiment of the application. As illustrated in FIG. 5, the biased transformer windings 320 may be integrated into, or around, CT modules 400. In such an embodiment, the biased transformer windings 320 may be a Ragowski helical coil or a biased winding toroid. Such an embodiment may enable the placement of the CT modules 400 into geometries that are typically too small for a full transformer winding. Such an embodiment may enable more accurate current readings.

Figure 6:
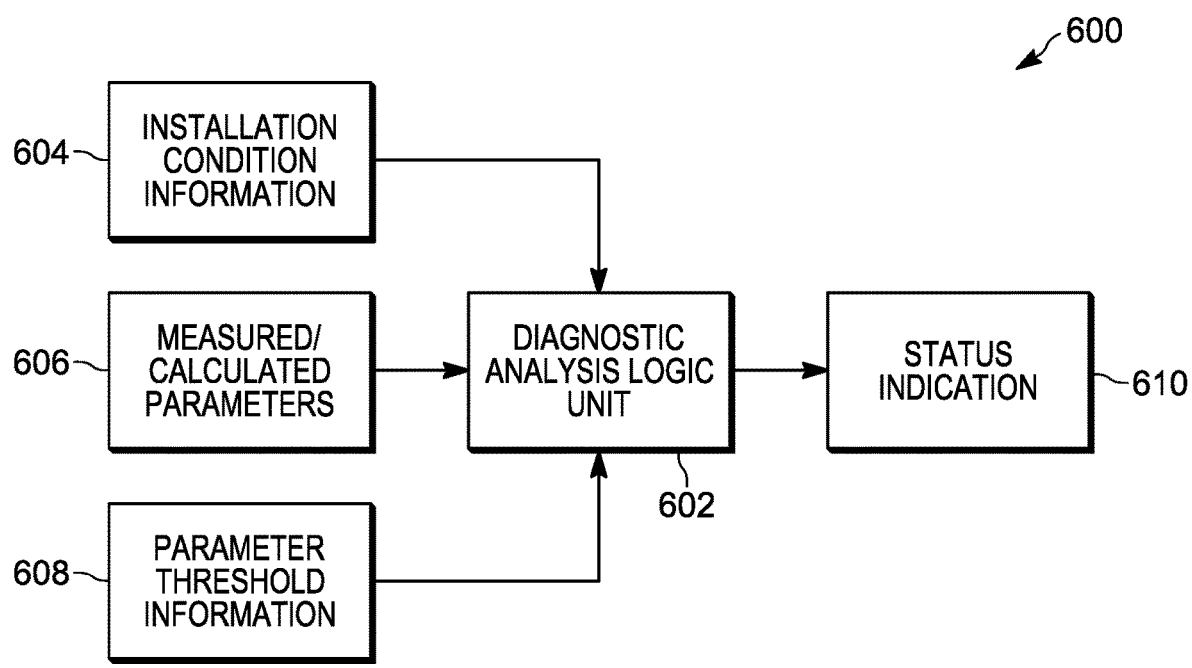
FIG. 6 is a block diagram illustrating the logic applicable to the power system of FIG. 1.

FIG. 6 is a process block diagram 600 illustrating a diagnostic analysis logic unit 602 applicable to the power system 100 of FIG. 1. For ease of description, FIG. 6 includes both functions which may be implemented in hardware and/or software and hardware components of the power system 100. In one embodiment, some or all of the functions of the diagnostic analysis logic unit 602 are implemented by the electronic processor of the electronic controller 335 (using software, hardware, or a combination of both). In further embodiments, some or all of the functions of the diagnostic analysis logic unit 602 are implemented by an external communication device, an external wiring device, and/or a remote server/database external to the power system 100. For example, the electronic processor may transmit the measurements of the sensors 325 to the one or more of the external communication device, the external wiring device, and/or the remote server/database or cloud network to be processed further. In some embodiments, some or all of the functions of the diagnostic analysis logic unit 602 are implemented on a user interface (for example, a graphic user interface).

The diagnostic analysis logic unit 602 is configured to receive data and information from a variety of sources including, for example, the sensors 325, the antenna 330, and the electronic processor. The diagnostic analysis logic unit 602 may also receive information (including, as described below, installation condition information 604, measured/calculated parameters 606, and parameter threshold information 608) from one or more of the load 110, the power supply 105, an external communication device, an external wiring device, and/or a remote server/database or cloud network. The data and information received relates to the operation of the power system 100. For example, as illustrated in FIG. 6, the diagnostic analysis logic unit 602 receives application and installation condition information 604 of the power system 100, measured/calculated parameters 606, and parameter threshold information 608 from the load 110, the sensors 325, the antenna 330, and/or the power supply 105. It should be understood that other kinds of data and information relating to the operation of the power system 100 may also be received. As explained in more detail below, the diagnostic analysis logic unit 602 is configured to process the data and information received to monitor the operation of the power system 100 and to detect one or more abnormalities in the system 100.

It should be understood that although the processes performed by the diagnostic analysis logic unit 602 are described herein as static logic, in some embodiments the diagnostic analysis logic unit 602 may be configured to perform one or more machine-learning or artificial intelligence process algorithms to perform or improve prediction or diagnostic capability based on the information received from the load 110 and/or connector 115. In such embodiments, the diagnostic analysis logic unit 602 may be configured to utilize predictive monitoring and diagnostic analysis in order to predict one or more of a potential abnormality.

The installation condition information 604 relates to expected ambient conditions such as an expected/allowed temperature range, an indoor versus outdoor use, a degree of climate control or non-climate control, a level of moisture/humidity, a natural temperature variation, a geographical location, and an installation location to derive parameter thresholds (described more particularly below) and anticipated cycles of operation.

For example, an installation in a non-climate controlled location may allow cold temperatures of operation. Installations in such conditions may not rely solely on maximum measured temperature to determine normal operation and identify potential issues such as poor terminations or connection issues. For example, the connector 115 may operate in an ambient temperature of approximately −20° C. and a terminal temperature of the connector 115 may be measured at approximately 20° C., such a 40° temperature rise may suggest an abnormal condition within the connector 115 or somewhere in the power system 100. Another example would be the connector 115 installed in a climate where the temperature may vary from approximately 10° C. to approximately 50° C. throughout the course of a day. In such cases, the system 100 may be configured to allow for the cyclical temperature swings, while also monitoring for abnormal conditions. The ambient temperature/climate conditions may be inferred from the sensors 325 internal or external to the connector 115 and/or received from a remote ambient sensor or external communication device. In some embodiments, the diagnostic analysis logic unit 602 is configured to learn the thermal environment in which the connector 115 is installed using one or more machine learning/artificial intelligence processes.

In some embodiments, information relating to operational requirements and acceptable operating ranges of the power system 100 and/or load 110 may be representative of the type of installation, such as an installation in an industrial facility or data center. The identification of the installation allows for certain parameter default values/predetermined thresholds that can serve as the starting configuration as opposed to a user individually setting each parameter. For example, in an industrial setting where the connector 115 is providing power to multi-phase, balanced industrial machines, the currents and voltages of each machine may be anticipated to be the same. When providing power for a data center however, the phases of the current and the voltage may be anticipated to be unbalanced depending on the load on each phase. The default configuration may further be adjusted based on additional information and/or user input. Such information regarding operating ranges and parameters may be received from the load 110, an external communication device or server, or received directly via a user input through a graphical interface in communication with the logic unit 602.

The measured/calculated parameters 606 may include data received and/or derived from values from one or more of the sensors 325. The measured/calculated parameters 606 include one or more electrical and/or thermal characteristics within the power system 100. For example, the sensors 325 may be configured to measure electrical and/or thermal characteristics at the input and output sides of each contact (for example contacts 310) or at other electrical connections within the connector 115. In some embodiments, the sensors 325 may be configured to measure characteristics at the power supply 105 and power terminals 210. In further embodiments, the measured/calculated parameters 606 may include humidity characteristics.

Electrical characteristic measurements and calculated values are used by the diagnostic analysis logic unit 602 to identify abnormal operating conditions within other types of devices (for example, a welded contact or stuck switch when phase voltages and currents do not behave as expected). For example, if a switch is expected to be open, then the current and a voltage on one side of the electrical connection may be expected to be approximately zero. The presence of voltage on the load side of the electrical connection or the flow of current may be indicative of a closed contact. Alternatively, the diagnostic analysis logic unit 602 uses the multiple voltage measurement points from the sensors 325 in combination with current level to identify high resistance conditions, which may be indicative of poor connections. The electrical characteristic information may also be used to identify and confirm a proper coupling sequence of components within the connector 115. For example, if a switch is expected to be closed, then voltage and current is expected. If no voltage and/or current is sensed, an improper coupling may be present.

In some embodiments, the measured/calculated parameters 606 are used by the diagnostic analysis logic unit 602 to identify a proper order of connections/disconnections within the power system 100. In some cases, certain connections within the connector 115 may require a connection to an electric ground (or power) before being connected. For example, a data connection within the electronic controller 335 may be required to be connected after one or more power connections of the electronic controller 335 are connected. Based on the measured/calculated parameters 606, the diagnostic analysis logic unit 602 may be able to determine whether the one or more power connections are connected (and their order of connection) before the data connection is made and determine an abnormal condition if the connections were done inappropriately. Likewise, the order of disconnection may be evaluated to determine an appropriate disconnection within the power system 100.

The diagnostic analysis logic unit 602 may also use temperature measurements to monitor and identify an abnormal condition within the power system 100. For example, the diagnostic analysis logic unit 602 may receive data from the sensors 325 regarding the temperature of each of the connection points (or line inputs) within the connector 115. From this data, the diagnostic analysis logic unit 602 may identify operation-related variations of the installation environment of the power system 100. As opposed to a single point measurement, the multiple point measurement method implemented using the sensors 325 allows the diagnostic analysis logic unit 602 to distinguish operational conditions from fault conditions. For example, when the power supply 105 and/or connector 115 is three-phase, if the temperatures of both the first phase and second phase contacts 310 within the connector 115 are measured to be approximately equal, or are within a predetermined range of each other, then the ambient temperature may be approximately equal or lower than these temperatures. Accordingly, if the temperature of the third phase contact 310 within the connector 115 differs from the temperatures of the first and second contacts 310 (outside the predetermined range), the difference may be a temperature rise indicative of a possible abnormal condition. The abnormal condition could be, for example, a loose wire termination. The diagnostic analysis logic unit 602 accordingly identifies which of the phase contacts 310 has the abnormal condition based on the data from the sensors 325.

In some embodiments, the diagnostic analysis logic unit 602 is configured to calculate an effective environmental temperature. In some embodiments, the effective environmental temperature, or minimum predicted operational, is the effective temperature in the environment surrounding the contact carrier 200. The diagnostic analysis logic unit 602 calculates the effective environmental temperature based on at least data from the sensors 325. The diagnostic analysis logic unit 602 may calculate the effective environmental temperature by using present and previously obtained electrical and temperature measurements from the other sensors 325 at various points within the connector 115. The effective environmental temperature may be used to determine an abnormality within the connector 115.

For example, in some embodiments the diagnostic analysis logic unit 602 collects a series of current measurements from each of the sensors 325 corresponding to one or more of the contacts 310 over time to develop a temperature rise curve for the contacts 310 and the connector 115. The diagnostic analysis logic unit 602 then identifies the contact 310 with the lowest measured temperature. The diagnostic analysis logic unit 602 then calculates the expected temperature rise for the lowest current. Under normal conditions, for an unbalanced system, the contact 310 with the lowest current may be the coolest. When the contact 310 with the lowest current does not exhibit the lowest measured temperature of the contacts 310 within a predetermined error threshold, an abnormality may be present.

The diagnostic analysis logic unit 602 calculates the effective/predicted environmental temperature by subtracting the expected temperature rise from the measured temperature. The diagnostic analysis logic unit 602 may also calculate the temperature deviation for each measured temperature for each contact 310 from the effective/predicted environmental temperature by comparing the temperature rise for each contact 310 to the expected temperature rise given the current. When the temperature rise for one or more of the contacts 310 does not fall within a predetermined range of the expected temperature rise given the current, an abnormality may be present.

An abnormal condition may be further diagnosed based on the additional information provided to diagnostic analysis logic unit 602. For example, if the temperatures of each of the contacts 310 are different, the diagnostic analysis logic unit 602 may examine/analyze their current values received from the sensors 325 to determine if the difference in their temperatures is abnormal. If the current within each of the contacts 310 are the same, a difference in temperature may indicate an abnormal condition. However, if the current within of each of the contacts 310 are different, a limited or predetermined difference in temperature may be expected during normal operation. The diagnostic analysis logic unit 602 may further identify the location of and/or components relative to the abnormal condition based on the information.

Figure 7A:
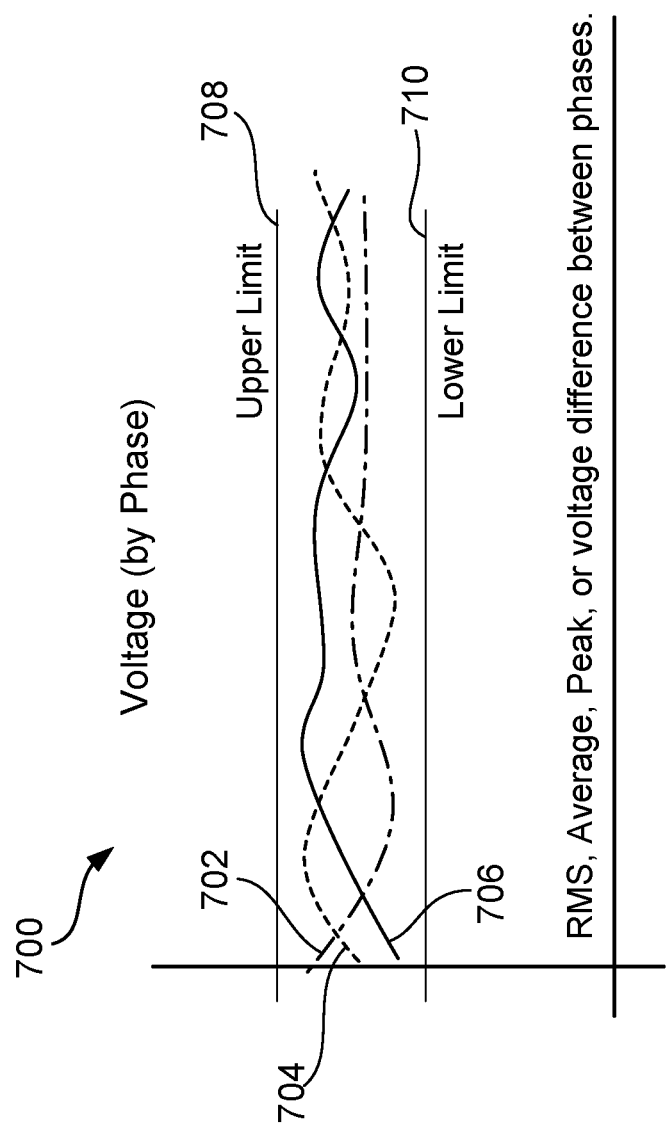
FIG. 7A is a graph illustrating a voltage parameter and parameter thresholds of the power system of FIG. 1.
Figure 7B:
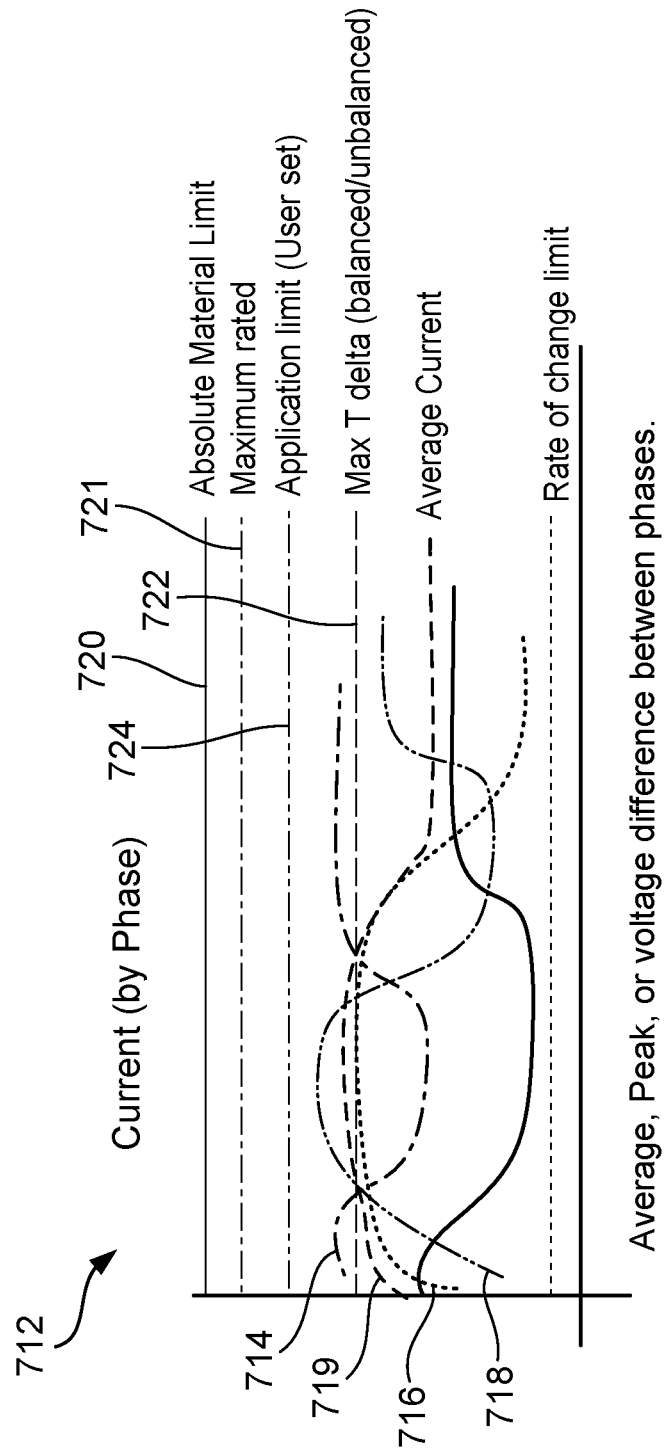
FIG. 7B is a graph illustrating a current parameter and parameter thresholds of the power system of FIG. 1.

The parameter threshold information 608 includes parameter thresholds that are used by the diagnostic analysis logic unit 602 to compare the measured parameters 606 to determine the operation status and conditions of the power system 100. Each parameter threshold corresponds to a desired parameter at a particular connection point and/or terminal within the connector 115. FIGS. 7A-7C each illustrate various parameters over time series of voltage, current, and temperature parameter thresholds respectively.

In some embodiments, the parameter thresholds may be fixed values. For example, a parameter threshold may be a maximum threshold (for example, 708) or a minimum threshold (for example, 710). A parameter threshold may be based on material properties (for example, absolute current or temperature material limit 720 and 734 respectively), material or product ratings (for example, maximum rated threshold 721), or application constraints (for example, application limit 724). A parameter threshold may also be based on a series of parameter data points indicative of a known operational behavior of the connector system. For example, the known operational behavior may be the anticipated temperature rise (or lack thereof) per amp of current or rate of change in temperature given a change in current. This known operational behavior may be stored in the memory or retrieved from a remote server/database or cloud network. Other parameter thresholds may be set at the time of manufacture based on calibration or configuration or at installation. When set at the time of installation, these parameter thresholds in some embodiments may be configured by a user. In some embodiments, the diagnostic analysis logic unit 602 may receive a user input via the user interface (for example, included in the load 110, the connector 115, and/or an external communication device) specifying a default parameter value/predetermined threshold or a custom parameter threshold setting. In such embodiments, the user input may be a predetermined parameter threshold profile, specifying a set of parameter thresholds for a particular application and/or environment. For example, the predetermined limit threshold profile adjusts the parameter thresholds based on the application, type of load (balanced or unbalanced), and installation setting (climate/temperature).

In some embodiments, the parameter thresholds are dynamically adjusted based on the measured/calculated parameters 606. The parameter thresholds may be adjusted depending on ambient temperature, current levels, operational cycle or historic data, or other parameters. By adjusting to the measured conditions and known parameters, and by being able to set these limits independently for each connection point, the diagnostic analysis logic unit 602 is able to determine an exact location of an abnormal condition and avoid false positive alerts.

When a condition is suspect based on the initial setup, the diagnostic analysis logic unit 602 may notify the user of the condition and provide an option for the user to flag the condition as acceptable under certain conditions—such as a higher absolute temperature if the ambient temperature increases substantially. Another example of a condition which needs normalization when the connector 115 is oriented in such a way that one of the connections is closer to an external heat source. This connection will permanently show a higher temperature. Accordingly, the user may choose to accept this as a "normal" condition.

In some embodiments, the diagnostic analysis logic unit 602 is configured to learn or normalize operational limits. The diagnostic analysis logic unit 602 may learn operational limits by, for example, implementing one or more machine learning/artificial intelligence processes. In such embodiments, the diagnostic analysis logic unit 602 may use machine learning or artificial intelligence in addition to or in lieu of user input. For example, the diagnostic analysis logic unit 602 may automatically determine whether a condition is acceptable or not without providing an option to the user.

FIGS. 7A-7C illustrate parameter graphs including possible parameter thresholds. It should be understood additional thresholds may be considered for each parameter. FIG. 7A illustrates a voltage over time graph 700. The graph 700 illustrates a first phase voltage 702, a second phase voltage 704, and a third phase voltage 706 measured within the connector 115. The graph 700 illustrates a maximum voltage threshold 708 and a minimum voltage threshold 710.

FIG. 7B illustrates a current over time graph 712. The graph 712 illustrates a first phase current 714, a second phase current 716, and a third phase current 718 measured within the connector 115. The average current 719 is also measured or calculated. The graph 712 illustrates an absolute material limit 720, a maximum rated current threshold 721, and a maximum current difference threshold 722. These parameter thresholds may be based on the material and application limitations and application of the connector 115 and/or load device 110. In some embodiments, similar parameter thresholds may be used with respect to voltage (FIG. 7A) The graph 712 also illustrates an application limit 724 which may be a custom parameter threshold defined by a user.

FIG. 7C illustrates a temperature over time graph 726. The graph 726 illustrates a first phase contact temperature 728, a second phase contact temperature 730, and a third phase contact temperature 732 measured within the connector 115. The average temperature 733 is also measured or calculated. The graph 726 illustrates an absolute material limit 734, a maximum difference in temperature limit 735, and a temperature increase rate threshold 736 (based on the application limitations). The graph 726 also includes a custom user selected application temperature increase rate threshold 737.

Returning to FIG. 6, the diagnostic analysis logic unit 602 is configured to determine, based on an analysis of one or more of the inputs received, an operation status of the power system 100. For example, the state of the connector 115, the load 110, the power supply 105, and the connections between are evaluated/analyzed to determine the operational status of the power system 100. The operational status may be normal if no abnormal conditions have been determined. The operational status may be abnormal is at least one abnormal condition is determined. The connector 115 is configured to adaptively provide power to a variety of loads and types of equipment. For example, when the connector 115 is serving multi-phase, balanced industrial machines, the currents and voltages are expected to be the similar in magnitude, so the system will react differently to variations in power and current through the connector 115 compared to serving a power strip in a data center where the phases are expected to be unbalanced depending on the load on each phase.

In some embodiments, the diagnostic analysis logic unit 602 is further configured to determine an operation status of the power system 100 based on information received from the load device 110. For example, if the load device 110 provides its own measured electrical characteristics, the diagnostic analysis logic unit 602 compares the received electrical characteristics to the corresponding electrical characteristics within the measured/calculated parameters 606 to identify a possible abnormal condition (for example, a power loss between the connector 115 and load device 110). In further embodiments, the results of the comparison may be used with machine learning and artificial intelligence algorithms to further improve prediction capability of machine or process deviation or failure.

The diagnostic analysis logic unit 602 may then generate, based on the status, a status indication 610. The status indication 610 is at least one selected from the group consisting of an audible, visual, and haptic signal. The indication may be presented by a visual signal for presentation on a display of a communication device, an audio signal, or an error signal for recordation in a log in the communication device or a remote server/database. In some embodiments, the electronic processor is further configured to send the error signal to an error log stored in either a local memory, for example the memory, or a remote server and/or database.

In some embodiments the diagnostic analysis logic unit 602 is configured to determine a degree of the operational status based on a comparison between the measured/calculated parameters 606 and the corresponding parameter threshold and generate a particular type of indication based on a severity of the abnormal condition. For example, depending on the severity of the abnormal condition, the diagnostic analysis logic unit 602 may generate a notification, alert, or an alarm.

In some embodiments, the diagnostic analysis logic unit 602 further includes a maintenance schedule tracker. The maintenance schedule tracker is configured to provide reminders via the user interface and record maintenance events in the memory and/or the remote server/database. The maintenance schedule may be defined by a user, for example via the user interface, or a default/predetermined schedule defined based on the application and/or environment of the power system 100. The maintenance schedule may further be dynamically adjusted by the diagnostic analysis logic unit 602 based on the installation condition information 604, the measured/calculated parameters 606, the parameter threshold information 608 and/or other operating conditions within the power system 100.

Thus, the application provides, among other things, an improved method and system for sensing various characteristics of an electronic power connector. In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 20%, in another embodiment within 10%, in another embodiment within 2% and in another embodiment within 1%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:
1. An electrical power system comprising:
   an electrical power connector;
   a contact configured to electrically connect a power supply to a load;
   a first sensor configured to sense a first characteristic of the electrical power connector;

a second sensor configured to sense a second characteristic of the electrical power connector; and an electronic controller configured to receive a first signal indicative of the first characteristic, receive a second signal indicative of the second characteristic, compare the first signal to a first parameter threshold, wherein the first parameter threshold corresponds to a desired parameter at least one selected from a group consisting of a connection point of the electrical power connector and a terminal of the electrical power connector, compare the second signal to a second parameter threshold, and dynamically adjust at least one selected from a group consisting of the first parameter threshold and the second parameter threshold, wherein the dynamic adjustment is based on at least one selected from a group consisting of an operational limit and a known operational behavior.

2. The electronic power system of claim 1, wherein the controller is further configured to determine an abnormal condition based on a comparison of the first signal to the first threshold.

3. The electronic power system of claim 1, wherein the controller is further configured to determine an abnormal condition based on a comparison of the second signal to the second threshold.

4. The electronic power system of claim 1, wherein the first sensor is a voltage sensor.

5. The electronic power system of claim 1, wherein the first sensor is a temperature sensor.

6. The electronic power system of claim 1, wherein the first sensor is a current sensor.

7. The electronic power system of claim 1, wherein the predetermined threshold is a default value based on an application of the electrical power system.

8. The electronic power system of claim 1, wherein the electronic controller is located within the electrical power connector.

9. The electronic power system of claim 1, wherein the electronic controller is located on at least one selected from the group consisting of an external communication device, an external wiring device, a remote server, and a cloud network.

10. The electronic power system of claim 1, wherein the controller is partially located within the electrical connector and partially located on at least one selected from the group consisting of an external communication device, an external wiring device, a remote server, and a cloud network.

11. The electronic power system of claim 1, wherein at least one of the first characteristic and the second characteristic is based on an installation condition.

12. The electronic power system of claim 11, wherein the installation condition is at least one selected from the group consisting of an expected/allowed temperature range, an indoor versus outdoor use, a degree of climate control or non-climate control, a level of moisture/humidity, a natural temperature variation, a geographical location, and an installation location.

13. The electronic power system of claim 1, wherein at least one of the first characteristic and the second characteristic is one selected from the group consisting of a temperature, a voltage, and a current.

14. The electrical power system of claim 1, wherein the controller is further configured to provide a maintenance schedule tracker.

15. The electrical power system of claim 1 further comprising a load, wherein the controller is further configured to determine an abnormal condition of the power system based on information received from the load.

16. The electrical power system of claim 1, wherein the controller is further configured to utilize machine learning and artificial intelligence algorithms to perform or improve prediction or diagnostic capability based on the information received from at least one selected from the load.

17. The electrical power system of claim 16, wherein the controller is further configured to utilize machine learning and artificial intelligence algorithms to further improve prediction capability based on the information received from the load.

18. A method of monitoring an electrical power system, the method comprising:

sense, via a first sensor, a first characteristic;

sense, via a second sensor, a second characteristic;

receive, via a controller, a first signal indicative of the first characteristic;

receive, via the controller, a first signal indicative of the first characteristic;

compare the first signal to a first parameter threshold, wherein the first parameter threshold corresponds to a desired parameter at least one selected from a group consisting of a connection point of the electrical power connector and a terminal of the electrical power connector;

compare the second signal to a second parameter threshold; and dynamically adjust at least one selected from a group consisting of the first parameter threshold and the second parameter threshold, wherein the dynamic adjustment is based on at least one selected from a group consisting of an operational limit and a known operational behavior.

19. The method of claim 18, further comprising determining an abnormal condition based on a comparison of the first signal to the first threshold.

20. The method of claim 18, further comprising determining an abnormal condition based on a comparison of the second signal to the second threshold.

* * * * *